(12) United States Patent
Kim

(10) Patent No.: US 6,770,561 B2
(45) Date of Patent: Aug. 3, 2004

(54) METHOD FOR DEPOSITING METAL FILM THROUGH CHEMICAL VAPOR DEPOSITION PROCESS

(75) Inventor: Younsoo Kim, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/321,729

(22) Filed: Dec. 18, 2002

(65) Prior Publication Data

US 2003/0134511 A1 Jul. 17, 2003

(30) Foreign Application Priority Data

Dec. 19, 2001 (KR) .......................................... 2001-81145
Nov. 28, 2002 (KR) .......................................... 2002-74872

(51) Int. Cl.[7] .............................................. H01L 21/44
(52) U.S. Cl. ........................ 438/674; 438/680; 438/686; 438/681
(58) Field of Search ........................................ 438/674

(56) References Cited

U.S. PATENT DOCUMENTS 6,403,414 B2 * 6/2002 Marsh ........................ 438/239

* cited by examiner

Primary Examiner—David Nelms
Assistant Examiner—Renee R. Berry
(74) Attorney, Agent, or Firm—Jacobson Holman PLLC

(57) ABSTRACT

The present invention provides a method for depositing a metal film capable of suppressing oxygen from remaining within the metal film and preventing clustering of the metal film due to a low temperature deposition by employing a chemical vapor deposition process and a method for depositing a Ru film using the CVD process. The present invention provides a method for depositing a metal film by using a chemical vapor deposition process, including the steps of: loading a substrate to a reactor where a metal film will be deposited; heating the substrate to densify the metal film as simultaneous to a deposition of the metal film; and depositing the metal film on the substrate by adding a precursor of the metal film and a reaction gas having a reducing ability to the heated substrate.

10 Claims, 5 Drawing Sheets

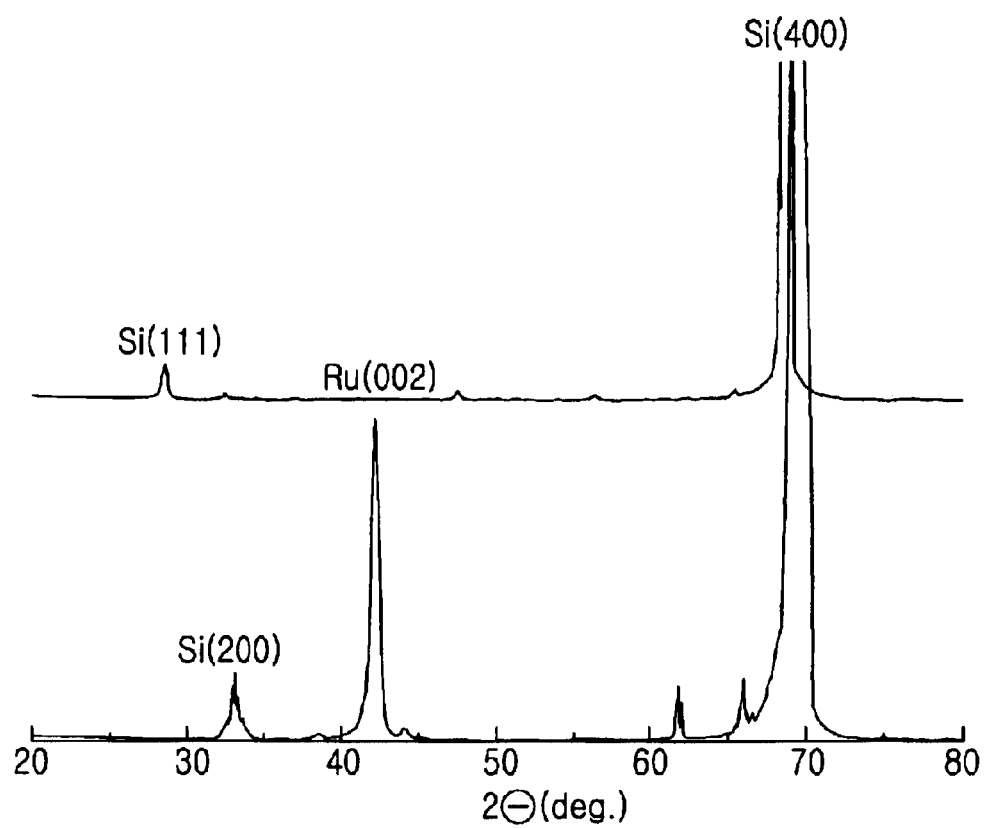

METHOD FOR DEPOSITING METAL FILM THROUGH CHEMICAL VAPOR DEPOSITION PROCESS

FIELD OF THE INVENTION

The present invention relates to a method for fabricating a semiconductor device; and, more particularly, to a method for depositing a metal film used as an electrode of a high dielectric capacitor and a ferroelectric capacitor in a dynamic random access memory (DRAM) and a ferroelectric random access memory (FeRAM) device.

DESCRIPTION OF RELATED ARTS

Generally, a chemical vapor deposition (CVD) process is used to deposit a thin film on a substrate such as an exposed surface of a wafer and a silicon wafer. A precursor used in the CVD process is a thermally decomposable volatile mixture contacting to a substrate heated above a decomposing temperature of the precursor. A layer deposited in accordance with the CVD process, e.g., a layer constituted with metal, a metal mixture, metal-alloy, ceramic, a metal compound or a mixture of the above materials is deposited on a substrate depending on a selection of the precursor and a reaction condition.

It is known that a Ru thin film formed through an integration process, particularly, the CVD process has excellent electric conductivity, high stability at a high temperature range and good adhesiveness with silicon, silicon oxide and ceramic oxide.

The Ru thin film is used as an electrode or a wiring material of a capacitor in a dynamic random access memory (DRAM) and ferroelectric random access memory (FeRAM) device with giga bites. Since the Ru thin film is nearly non-reactive with silicon or metal oxides, it is possible to be used as a barrier against silicon or oxygen. Also, the Ru thin film can be used as a catalyst for high polymer synthesis.

Currently, there have been various studies on precursors of Ru used in the CVD process for depositing the Ru film.

The following will describe the CVD process for depositing the Ru film in accordance with a prior art.

$RuX_n$ is a precursor compound of the Ru used in the CVD process for a typical Ru film deposition. With use of $O_2$ gas as a reaction gas, the Ru film is deposited based on the following reaction equation.

$$RuX_n + O_2 \rightarrow Ru + \text{reaction product} \quad \text{Equation 1}$$

However, there are problems in the prior art. First, there occurs the agglomeration phenomenon during a thermal process due to a low density of the Ru film. The Ru film is deposited at a temperature ranging from 250° C. to about 350° C. Because the Ru is deposited at a low temperature and impurities are included in the deposited Ru film due to this low deposition temperature, the Ru film has a decreased density. It is necessary to treat the Ru film with a high thermal process. However, there occurs severe agglomeration phenomenon as the Ru film is crystallized during the high thermal process.

Continuous to the first explained problem, $O_2$ gas employed as the reaction gas in the CVD process is contained within the Ru film and oxidizes a bottom layer, e.g., a diffusion barrier layer applied on between a plug and a bottom electrode. Although the reaction gas is $O_2$, which is an oxidizing gas, the Ru film is reduced and deposited as a metal layer. Therefore, the reaction between the Ru precursor and the $O_2$ gas become very complex, and large amounts of impurities, particularly $O_2$, remain within the deposited layer.

The $O_2$ included in the Ru film is eventually diffused and oxidizes the diffusion barrier layer such as a TiN layer, thereby reducing electric properties.

Third, the Ru precursor is decomposed in a vapor phase, and subsequently a particle is generated. Since the Ru precursor strongly reacts with the $O_2$ gas in a vapor phase, there occurs vapor decomposition before reaching to a substrate. Due to this vapor reaction, volatile materials, mainly carbonates and oxides, are formed on top of the Ru film in cluster forms. These volatile materials become a main factor for generating the particle.

SUMMARY OF THE INVENTION

It is, therefore, an object of the present invention to provide method for depositing a metal film capable of suppressing oxygen from being remained within the deposited film and preventing clustering of the metal film due to a low thermal deposition by employing a chemical vapor deposition (CVD) process and a method for depositing particularly a Ru film by using the same CVD process.

It is another object of the present invention to provide a method for forming a capacitor capable of preventing a bottom layer of the Ru film from being oxidized when depositing a bottom electrode with use of the Ru film.

In accordance with an aspect of the present invention, there is provided a method for depositing a metal film by using a chemical vapor deposition process, including the steps of: loading a substrate to a reactor where a metal film will be deposited; heating the substrate to densify the metal film as simultaneous to a deposition of the metal film; and depositing the metal film on the substrate by adding a precursor of the metal film and a reaction gas having a reducing ability to the heated substrate.

In particular, the substrate at the step of heating the substrate is heated to a temperature ranging from about 350° C. to about 900° C. Also, the metal film is any one selected from a group consisting of Ru, Fe, Os, Co, Rh, Ir, Ni, Pd and Pt.

In accordance with another aspect of the present invention, there is also provided a method for forming a capacitor, including the steps of: forming an inter-layer insulating layer on a substrate; forming a connection pattern stacked sequentially of a plug contacting to the substrate by passing through the inter-layer insulating layer and a diffusion barrier layer; depositing a metal film for a bottom electrode on the connection pattern by employing a chemical vapor deposition process with use of a reductive reaction gas so to perform the deposition and densification of the metal film simultaneously; and forming sequentially a dielectric layer and a top electrode on the metal film.

In addition, the step of depositing the metal film is proceeded at a temperature ranging from about 350° C. to about 900° C. Furthermore, the reaction gas having a strong reducing ability is any one selected from a group consisting of $NH_3$, $H_2$, hydrazine ($N_2H_4$), $Me_2NNH_2$, $NH_2R$, $NHR_2$, $NR_3$, alkyl hydrazine having about 1 to 10 carbon branches, dialkyl hydrazine having about 1 to 10 carbon branches and a mixed gas of the above substrates. Meanwhile, the R is any one selected from a group consisting of $H_2$, alkyl having about 1 to 10 carbon branches, alkenyl having about 1 to 10 carbon branches, alkoxy having about 1 to 8 carbon branches, aryl having about 6 to 12 carbon branches and a derivative of the above substrates added with one of halogen elements.

BRIEF DESCRIPTION OF THE DRAWING(S)

The above and other objects and features of the present invention will become apparent from the following description of the preferred embodiments given in conjunction with the accompanying drawings, in which:

FIG. 5 is an X-ray diffraction analysis result;

DETAILED DESCRIPTION OF THE INVENTION

Figure 1:
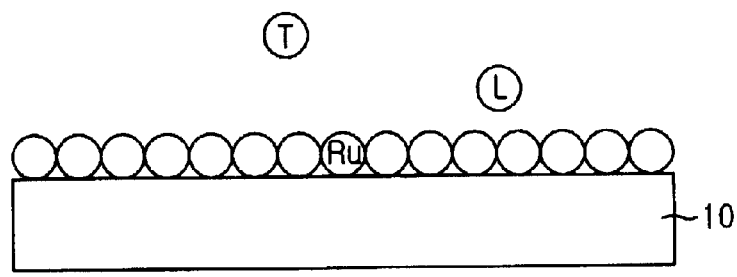
FIG. 1 is a diagram showing a method for depositing a Ru film by using a chemical vapor deposition (CVD) process in accordance with a first preferred embodiment of the present invention.

The following will describe a method for depositing a Ru film by employing a chemical vapor deposition (CVD) process in accordance with a first preferred embodiment of the present invention.

In the first preferred embodiment, when depositing a Ru film by employing the CVD process, a Ru precursor of which oxidation state is 0 is used. Particularly, the Ru precursor is a compound obtained by combining Ru and a neutral ligand, e.g., L. diene or triene.

Herein, the L, which is an abbreviation of Lewis base, is a typical ligand. The diene (D) is a compound having two double couplings of C—C within a molecule while the triene is a compound having three double couplings of C—C within a molecule.

There are provided chemical equations expressing examples of the above-described Ru precursor.

| $TRuL_2$ | Chemical Equation 1 |
| $RuL_5$ | Chemical Equation 2 |
| $DRuL_3$ | Chemical Equation 3 |
| $TRuD$ | Chemical Equation 4 |
| $D_2RuL$ | Chemical Equation 5 |

In the chemical equations 1 to 5, T denotes any triene selected from a group consisting of a linear triene, a branched triene, a cyclic triene, a bicyclic triene or a tricyclic triene. Meanwhile, D denotes any diene selected from a group consisting of a linear diene, a branched diene, a cyclic diene, a bicyclic diene or a tricyclic diene. Also, L is selected from a group consisting of CO, CS, $CS_2$, RCN, RNC, $NR_3$, $NR_2R'$, ROR', RSR', polyester about 1 to 20 carbon branches, polyamine having about 2 to 20 carbon branches and a derivative of these substrates added with one of halogen elements, e.g., Fe. At this time, each of R and R' can be $H_2$, alkyl having about 1 to 10 carbon branches or a derivative of the alkyl having about 1 to 10 carbon branches added with one of halogen elements.

In the above chemical equations, the D uses $C_4H_4$, $C_5H_6$, $C_6H_8$, $C_7H_{10}$, $C_8H_{12}$, whereas the T uses $C_6H_6$, $C_7H_8$, $C_8H_{10}$ and so forth.

The following will explain the method employing the CVD process with use of the above-described Ru precursor. In the following preferred embodiment, a reaction gas uses a reductive gas such as $NH_3$.

For instance, the method for depositing a Ru film by employing the CVD process using the $TRuL_2$ precursor from the Chemical Equation 1 and $NH_3$ as the reaction gas will be explained in the following.

Firstly, the Ru precursor, $TRuL_2$ is sent to a vaporizer flowing about 500 sccm of a carrier gas, $N_2$. The $TRuL_2$ is vaporized at the vaporizer heated to about 200° C. and then sent again to a reactor by using Ar heated to the same temperature as a carrier gas. At this time, a flow quantity of Ar is about 200 sccm.

Next, the reaction gas, $NH_3$ is heated to about 200° C. and sent to the reactor.

Then, a temperature of a substrate where the Ru film will be deposited is maintained within a range from about 350° C. to about 900° C. Also, a pressure of the reactor is maintained in about 1 Torr. Under these conditions, the $TRuL_2$ and the $NH_3$ are reacted with each other so to deposit a pure Ru film.

At this time, the $TRuL_2$ and the $NH_3$ hardly react at a temperature maintained around 200° C., but react on a substrate maintained within a range from about 350° C. to about 900° C. so that the Ru film is deposited.

In the meantime, the remaining $TRuL_2$ and $NH_3$, which do not participate in the above reaction, and decomposition products, which are byproducts from the reaction, are removed with vacuum out.

The $TRuL_2$ has sequential reactions on the substrate 10 as shown in the following (referring to FIG. 1).

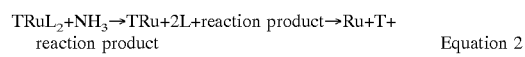

$TRuL_2+NH_3 \rightarrow TRu+2L+$reaction product$\rightarrow Ru+T+$reaction product    Equation 2

As shown in the above reaction equation 2, the L, which has a weak affinity, is firstly decomposed. Then, the T is secondly decomposed. In case of $DRuL_3$, $D_2RuL$ and $RuL_6$, the L having a weak affinity is firstly decomposed, and the D is decomposed thereafter. Meanwhile, in case of TRuD, the D having a weaker affinity is firstly decomposed, and the T is secondly decomposed. At this time, the T and L, which are thermal decomposition products, are removed with vacuum.

In case of using the precursors of Chemical Equations 2 to 5 in addition to the case of using the precursor of Chemical Equation 1, the L, D and T are decomposed from the Ru due to a thermal reaction since the L, D and T are neutral ligands. After the decomposition, they are not included in the Ru film but discharged from the reactor to a vacuum exhaust pipe. Thus, it is possible to deposit a highly pure Ru thin film nearly without any remaining impurities such as carbon, hydrogen and oxygen.

As seen from the above, there remains no oxygen within the Ru thin film due to the use of $NH_3$ as the reaction gas, thereby using the Ru thin film as a bottom electrode. Specifically, when using a TiN layer as a diffusion barrier layer at a lower side of the bottom electrode, it is possible to prevent oxidation of the TiN layer.

Additionally, the Ru thin film is deposited at a relatively high temperature ranging from about 350° C. to about 900° C., and thus, it is also possible to omit an additional thermal process for densifying the Ru film.

Furthermore, the Ru precursor added to the reactor and the $NH_3$ hardly react with each other at a vapor phase of which temperature is maintained around 200° C., and this factor results in suppression of particle generation. That is, since there is a large temperature difference between a vaporization temperature of the Ru precursor, i.e., about 200° C. and a deposition temperature, i.e., about 350° C.~900° C., a vapor decomposition reaction does not occur even if the Ru precursor and the $NH_3$ present in vapor.

The following will describe the method for depositing a Ru film by employing the CVD process in accordance with a second preferred embodiment of the present invention.

In this preferred embodiment for depositing the Ru film through the use of the CVD process, $RuX_2$ and $RuX_3$ wherein oxidation states of the Ru are +2 and +3 are used as a Ru precursor and NH3 as a reaction gas.

Herein, the X is any one selected from a group consisting of $H_2$, alkyl of which having about 1 to 10 carbon branches, alkenyl having about 2 to 10 carbon branches, alkoxy having about 1 to 8 carbon branches, aryl having about 6 to 12 carbon branches, β-diketonate having about 3 to 20 carbon branches, cyclopentadienyl, alkyl-cyclo-pentadienyl and a derivative of the above substrates added with one of halogen elements.

Figure 2A:
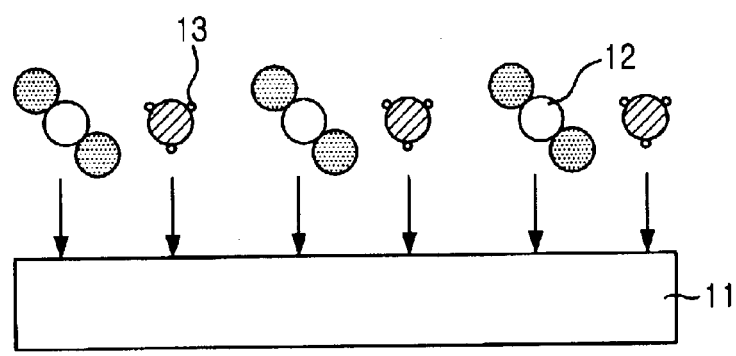
FIGS. 2A and 2B are diagrams showing a method for depositing a Ru film by using the CVD process in accordance with a second preferred embodiment of the present invention.
Figure 2B:
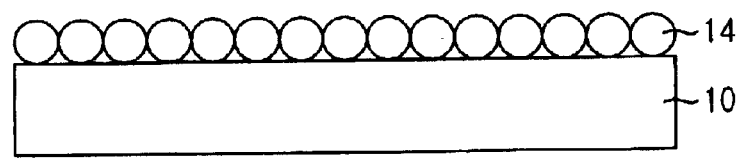

FIGS. 2A and 2B are diagrams showing a method for depositing a Ru film by employing the CVD process using the $RuX_2$ and the $NH_3$.

Referring to FIG. 2A, the Ru precursor, $RuX_2$, is sent to a vaporizer by using a carrier gas, $N_2$. The $RuX_2$ is vaporized at the vaporizer heated to about 200° C. A reference numeral 12 in FIG. 2A denotes the vaporized $RuX_2$. By using Ar as a carrier gas, the $RuX_2$ 12 is sent to a reactor including a substrate 11 where the Ru film will be subsequently deposited. Herein, the Ar is heated to the same temperature of the heated vaporizer.

Then, the reaction gas, $NH_3$ 13, is heated to about 200° C. and sent to the reactor.

Referring to FIG. 2B, the $RuX_2$ 12 added into the reactor and the $NH_3$ 13 hardly react with each other at a vapor phase wherein a temperature is maintained around 200° C. However, the above two substrates react on the substrate 11 heated to a range of temperature between about 350° C. and about 900° C. so that a Ru film 14 is deposited thereon.

At this time, the remaining $RuX_2$ and $NH_3$ after the above complete reaction, reaction products and decomposition products are removed with vacuum.

In the above first and the second preferred embodiments, the $NH_3$ is used as the reaction gas. However, it is still possible to attain the same effect as of the first and the second preferred embodiments even in case of using a reaction gas having a strong reducing ability as like the $NH_3$.

Such gases as $H_2$, hydrazine ($N_2H_4$), $Me_2NNH_2$, $NH_2R$, $NHR_2$, $NR_3$, alkyl hydrazine having about 1 to 10 carbon branches, dialkyl hydrazine having about 1 to 10 carbon branches or a mixed gas of the above listed substrates are gases that can be used as the reaction gas having a strong reducing ability. The R in the above exemplified gases can be any one selected from a group consisting of $H_2$, alkyl having about 1 to 10 carbon branches, alkenyl having about 2 to 10 carbon branches, alkoxy having about 1 to 8 carbon branches, aryl having about 6 to 12 carbon branches and a derivative of the above listed substrates added with one of halogen elements.

Also, the carrier gas of the vaporized Ru precursor is selected any one from a group consisting of He, Ne, Ar, $H_2$, $NH_3$ and a mixed gas of these listed gases.

Figure 3:
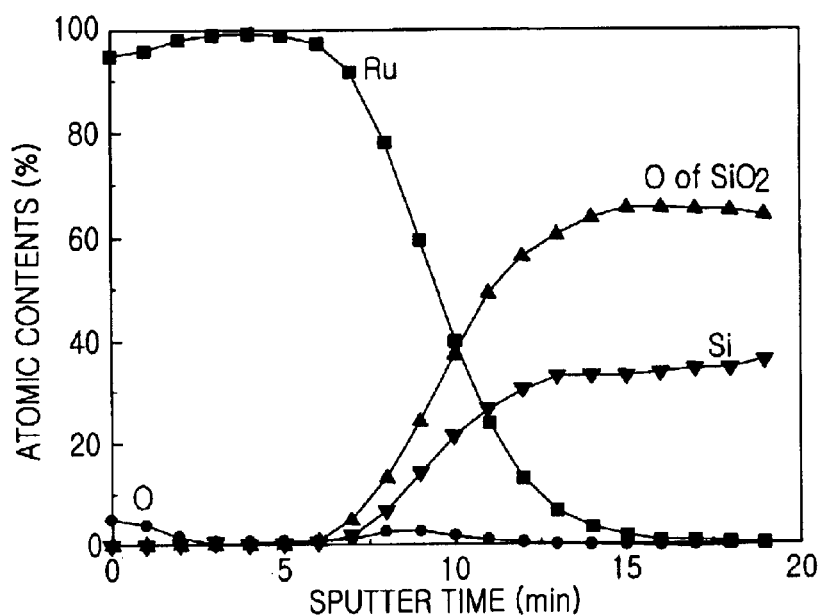
FIG. 3 is an Auger electron spectroscopy (AES) analysis result of a Ru film formed through a reaction of ammonia gas with a Ru precursor.

FIG. 3 is an Auger electron spectroscopy (AES) analysis result of a Ru film formed through a reaction between a Ru precursor and NH3 gas. With reference to FIG. 3, a horizontal axis represents sputter times where an ion beam for verifying atomic distributions in accordance with changes in thickness are sputtered. On the other hand, a vertical axis represents atomic contents (%) of atoms extracted in accordance with the sputter time. Meanwhile, the AES analysis is an elemental analysis of a sample by detecting emissions of Auger electrons among particles such as reflection electrons, primary electrons, Auger electrons, continuous X-rays, specific X-rays that are emitted due to mutual reactions between electrons and a substrate existing on a surface of the sample when the surface of the sample are scanned with electrons.

With reference to FIG. 3, electron lines of a sample containing a triple layer of $Si/SiO_2/Ru$ are examined, and particularly emitted Auger electrons are detected. From the detection, it is shown that there is nearly no $O_2$ existing within the Ru film.

Figure 4:
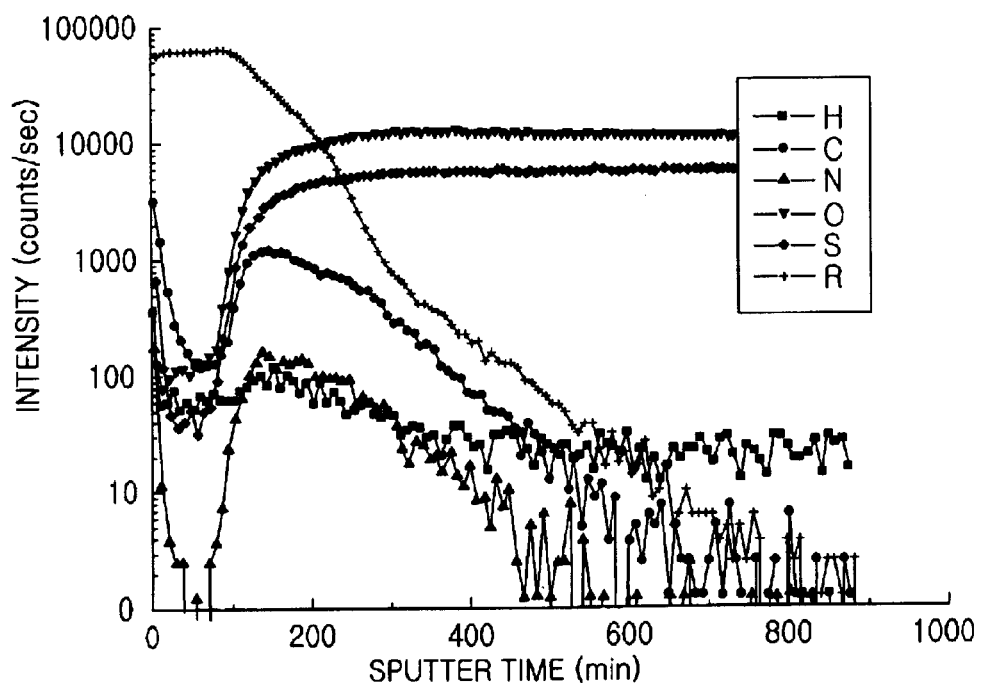
FIG. 4 is a secondary ion mass spectrometry (SIMS) analysis result of a Ru film formed in accordance with the method using the CVD process.

FIG. 4 is a secondary ion mass spectrometry (SIMS) analysis result of the Ru film deposited in accordance with the CVD process. In FIG. 4, a horizontal axis represents sputter times while a vertical axis represents intensities measured counts per second. As well known, the SIMS analysis analyzes masses of ions emitted after firstly inputting about 1 KeV to 20 KeV of primary ions into a sample and sputtering thereafter. This SIMS analysis makes it possible not only to measure masses and compositions of impurities but also to measure distributions in a depth direction.

According to FIG. 4, it is indicated that levels of existing impurities such as H, C, N, O, Si and so forth are very low.

The following Table 1 compares densities of each Ru film deposited in accordance with the different deposition processes. Especially, the density of the Ru film is measured with use of X-ray reflectivity (XRR).

TABLE 1

| Deposition Techniques | CVD Ru (400° C.) | PVD Ru | CVD Ru (350° C. to 900° C.) |
|---|---|---|---|
| Density (g/cm3) | 6.6 | 11.94 | 11.96 |

Based on Table 1, the density of the Ru film deposited in accordance with the CVD process at a low temperature, i.e., around 400° C. is about 6.6 while that of the Ru film deposited in accordance with the CVD process at a high temperature is about 11.96. This result means that the Ru film deposited at a high temperature is denser than the Ru film deposited at a low temperature. Meanwhile, the density of the Ru film deposited in accordance with the CVD process at a high temperature is similar to that of the Ru film deposited in accordance with a physical vapor deposition (PVD) process.

FIG. 5 is an analysis result of X-ray diffraction (XRD).

As shown in FIG. 5, it is indicated that Ru 002 has a peak where 2θ ranges between about 40° and about 45°. Also, the XRD analysis result shows that the Ru 002 is oriented in a direction of C axis. The Ru eventually has a hexagonal close packed (HCP) crystal structure.

Next, there is described a thermal desorption mass spectroscopy (TDS) analysis result in respects of a Ru film deposited in accordance with the CVD process particularly using $NH_3$ as a reaction gas and another Ru film deposited in accordance with the CVD process particularly using $O_2$ as a reaction gas. Herein, the Ru film deposited in accordance with the CVD process using $NH_3$ as the reaction gas is denoted as a first sample. Also, the Ru film deposited in accordance with the CVD process using $O_2$ as the reaction gas is denoted as a second sample.

Figure 6A:
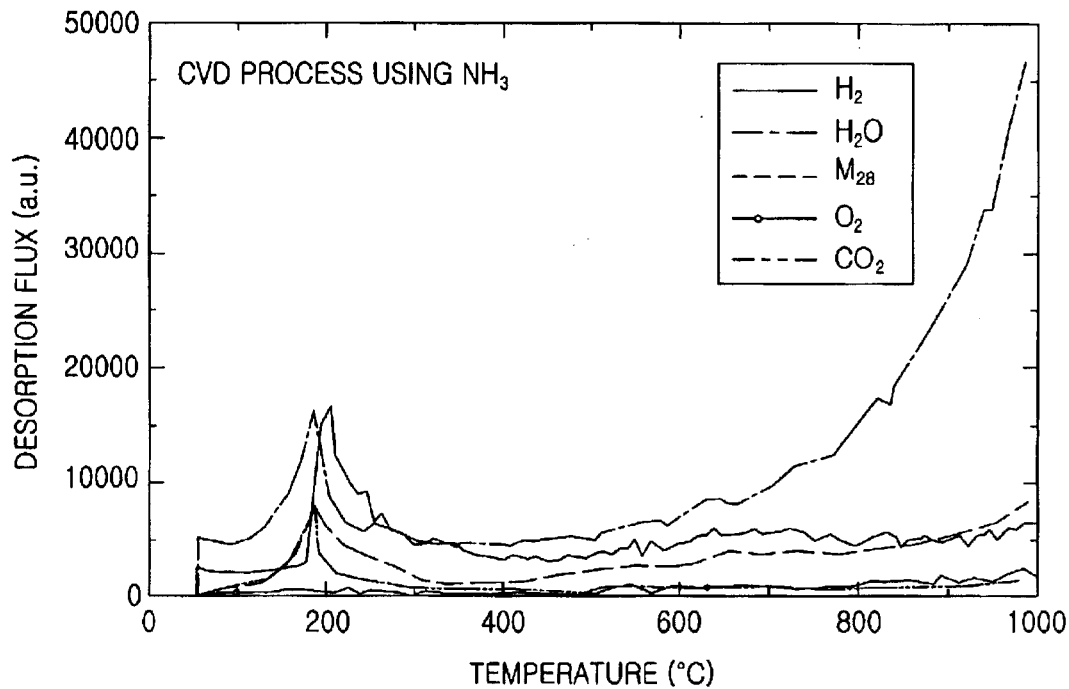
FIGS. 6A and 6B show amounts of impurities in the Ru films deposited in accordance with the CVD process particularly using $NH_3$ and $O_2$ as reaction gases, wherein the amounts of the impurities are measured by a thermal desorption mass spectroscopy (TDS) after depositing the Ru films and after being exposed in the air.
Figure 6B:
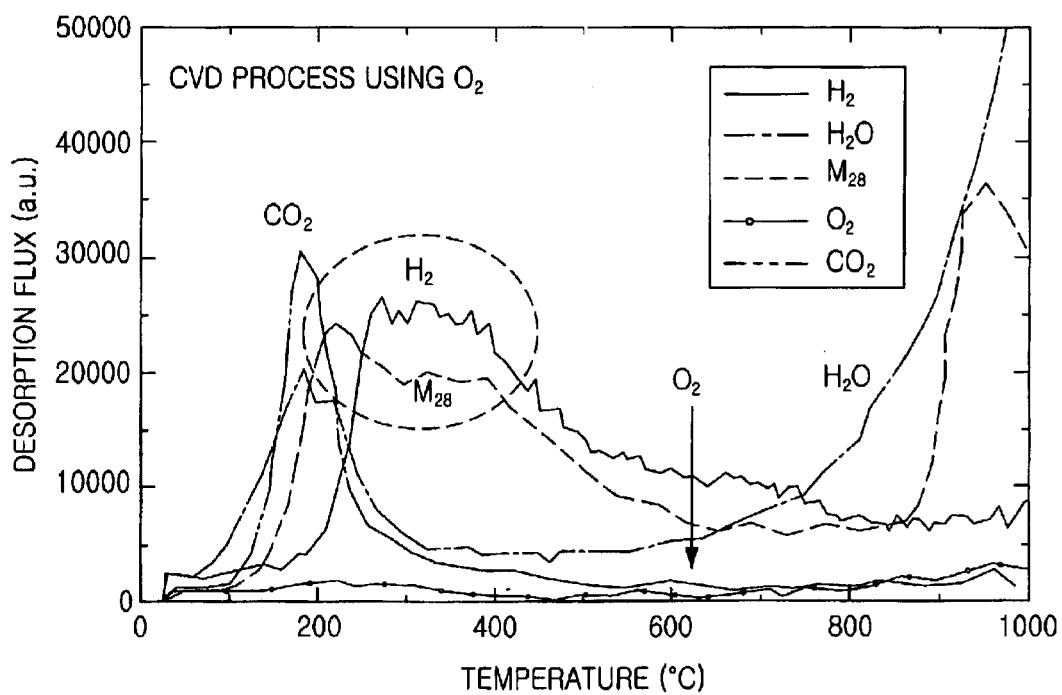

FIGS. 6A and 6B show amounts of impurities in the Ru films deposited in accordance with the CVD process particularly using $NH_3$ and $O_2$ as reaction gases. The amounts of the impurities are measured by a thermal desorption mass spectroscopy (TDS) after depositing the Ru films and after being exposed in the air. The TDS analysis is a method of measuring particles emitted from a heated sample. Specifically, FIG. 6A is a result obtained from the first sample, while FIG. 6B is a result obtained from the second sample. The samples are heated from a room temperature to about 1000° C. by means of a TDS analysis device, and amounts of impurities undergone desorption from the samples are quantified thereafter.

In FIGS. 6A and 6B, both vertical axes represent a desorption flux of the impurities while both horizontal axes represent temperature. Herein, the vertical axes are expressed in a linear scale and measured in a.u.

With reference to FIGS. 6A and 6B, in case of comparing the measured results obtained at a temperature around 200° C., an amount of $H_2$ desorption in the first sample is approximately 15000 a.u. On the other hand, an amount of $H_2$ desorption in the second sample is approximately 25000 a.u. In addition, an amount of $CO_2$ desorption in the first sample is below approximately 10000 a.u. However, an amount of $CO_2$ desorption is approximately 30000 a.u.

Also, an amount of desorption of $M_{28}$, e.g., CO and $C_2H_4$ is approximately 8000 a.u. in the first sample, whereas an amount of desorption of $M_{28}$ is approximately 25000 a.u. in the second sample.

According to the above measured result, the Ru film deposited in accordance with the CVD process using the $NH_3$ as the reaction gas contains less amounts of impurities within the Ru film.

Figure 7:
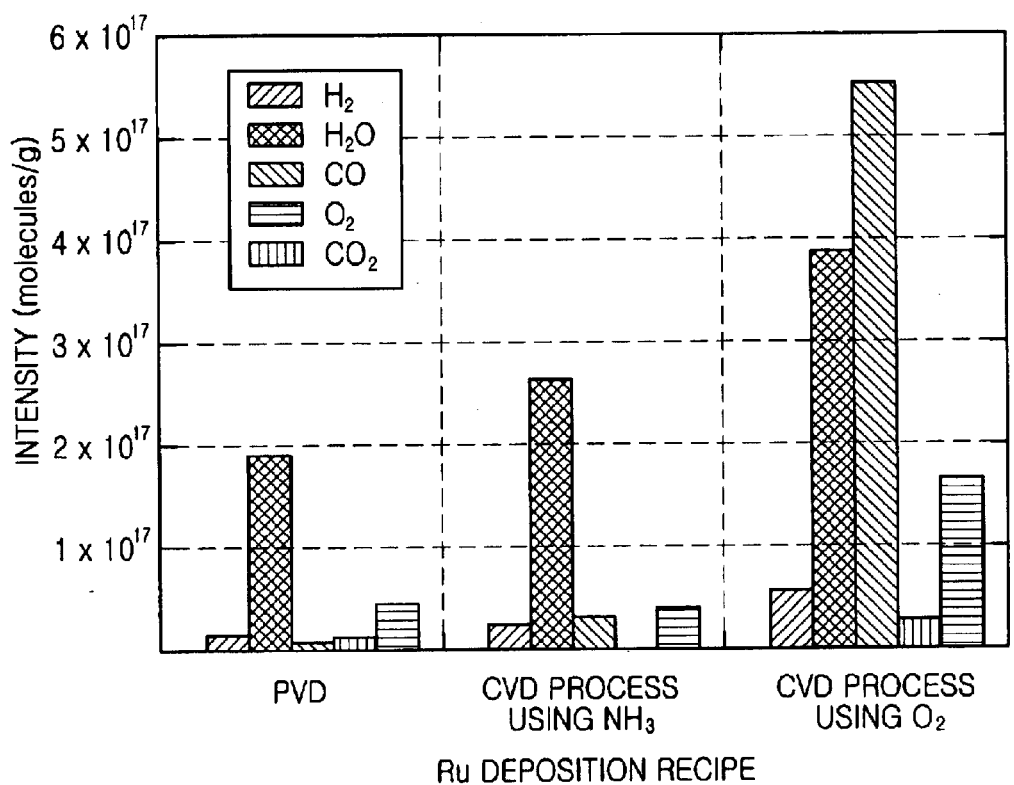
FIG. 7 is a diagram showing quantified results of the TDS analysis.

FIG. 7 is a diagram showing quantified results of the TDS analysis. A vertical axis represents intensities expressed in a linear scale and measured in molecules per gram while a horizontal axis represents types of deposition recipe. The provided types of the deposition recipe in FIG. 7 are the PVD, the CVD using $NH_3$ gas ($NH_3$-CVD) and the CVD using $O_2$ gas ($O_2$-CVD) as listed from the left side. A height of each bar expresses intensity of the impurities contained within each of the Ru film deposited in accordance with each corresponding deposition process.

As illustrated in FIG. 7, the CVD process using the $NH_3$ gas has lower $H_2O$, CO and $H_2$ intensities compared to the CVD process using the $O_2$ gas. Particularly, $O_2$ is not nearly included in the Ru film.

Additionally, it is shown that the result from the CVD process using the $NH_3$ gas is similar to the result from the PVD process.

Figure 8:
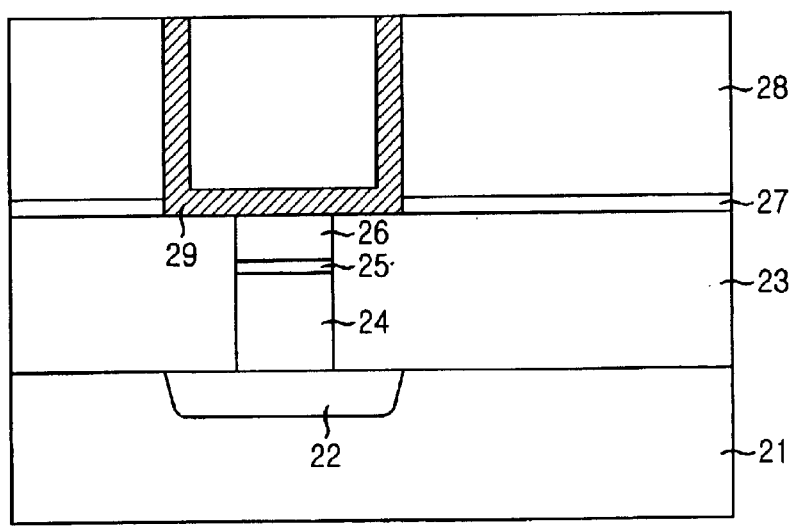
FIG. 8 is a cross-sectional view showing a capacitor formed in accordance with the first and the second preferred embodiments of the present invention.

FIG. 8 is a cross-sectional view showing a capacitor formed in accordance with the first and the second preferred embodiments of the present invention.

Referring to FIG. 8, an inter-layer insulating layer (hereinafter referred as to ILD) 23 is formed on a substrate 21 completed with a transistor formation process including a source/drain 22. On top of the ILD 23, a contact mask is formed through a typical photo-exposure and developing processes. The ILD 23 is etched with use of the contact mask so as to form a contact hole exposing a predetermined portion of the source/drain 22. The contact mask is removed thereafter.

Then, polysilicon is deposited entirely on the above structure including the contact hole. Then, an etch-back process is proceeded to form a polysilicon plug 24 buried within a predetermined portion of the contact hole, thereby forming a recess with a predetermined depth.

On an entire surface of the above structure, Ti is deposited and subsequently proceeded with a rapid thermal process (RTP) to induce a reaction between Ti and silicon provided from the polysilicon plug 24. As a result of this reaction, a Ti-Silicide layer 25 is formed on the polysilicon plug 24. At this time, the Ti-silicide 25 is an Ohmic contact layer for improving contact resistance between the polysilicon plug 24 and a subsequent bottom electrode.

Continuous to the formation of the Ti-silicide layer 25, a TiN layer 26 is formed thereon. Then, the TiN layer 26 is proceeded with a chemical mechanical polishing (CMP) process or an etch-back process until exposing a surface of the ILD 23. After the CMP process or the etch-back process, the TiN layer 26 is buried inside of the contact hole.

Herein, the TiN layer 26 acts as a diffusion barrier layer for preventing oxygen remaining inside of the bottom electrode from diffusing into the polysilicon plug 24 while applying a subsequent thermal process to a subsequent dielectric layer.

Next, an etch stop layer 27 and a capacitor oxide layer 28 are formed on top of the ILD 23 including the TiN layer 26. The capacitor oxide layer 28 is firstly etched with use of a storage node mask. Then, the etch stop layer 27 is etched so to open a concave part being aligned to the polysilicon plug 24.

Along a surface of the capacitor oxide layer 28 of which concave part is opened, a Ru film 29 is deposited at a temperature ranging from about 350° C. to about 900° C. by employing the CVD process. At this time, the CVD process implemented for depositing the Ru film 29 is in accordance with the first and the second preferred embodiments of the present invention.

Next, the etch-back process or the CMP process is used to make the Ru film 29 remain only within the concave part so to use the remaining Ru film 29 as the bottom electrode isolated from others in neighboring cells.

Although it is not shown in FIG. 8, a dielectric layer and a top electrode are subsequently formed, thereby completing a concave type capacitor formation.

Based on FIG. 8, there is nearly no remaining oxygen within the Ru film 29 formed in accordance with the first and the second preferred embodiments. Thus, it is possible to prevent the TiN layer 26, which is the diffusion barrier layer, from being oxidated due to diffusions of oxygen when performing a thermal process for crystallizing the dielectric layer. Also, since the Ru film 29 is deposited at a high temperature, it is not necessary to perform an additional thermal process.

The Ru film 29 is deposited on stacked layers of Si, Ti-silicide and TiN by employing the CVD process using either $NH_3$ gas or $O_2$ gas.

In case of deposing the Ru film 29 through the CVD process using the $NH_3$ gas, the TiN layer 26 is not oxidated. On the other hand, in case of depositing the Ru film 29 through the CVD process using the $O_2$ gas, the TiN layer 26 becomes oxidated, and bubbles are subsequently formed.

The Ru film 29 formed through the CVD process provided from the present invention is also applicable for a cylinder type capacitor and an electrode of a stacked type capacitor in addition to the concave type capacitor. Furthermore, the Ru film 29 can be applied to a dynamic random access memory (DRAM) device and a ferroelectric random access memory (FeRAM) device.

In the above-provided preferred embodiments, the CVD process using the $NH_3$ gas as a reaction gas is utilized to deposit the Ru film 29. However, it is still possible to deposit such metal thin films as Fe, Os, Co, Rh, Ir, Ni, Pd, Pt and so on by using the CVD process. In other words, even in case of depositing these metal thin films with use of the CVD process, the deposition occurs at a temperature ranging from about 350° C. to about 900° C. in order to densify the metal thin film as simultaneous to the metal deposition. Also, it is possible to prevent impurities from being remained within the deposited layer by using a reaction gas having a strong reducing ability.

Since the Ru film does not contain oxygen within the layer, it is possible to form a highly pure Ru film. When applying this highly pure Ru film as a bottom electrode of a capacitor, the Ru film prevents oxidation of the diffusion barrier layer formed at a lower side of the bottom electrode so as to improve electric properties of a semiconductor device.

Also, since the Ru film is deposited at a high temperature, it is possible to omit an additional thermal process and further to simplify a process.

Furthermore, since the Ru precursor does not have a decomposition reaction in a vapor phase, it is possible to suppress generation of particles.

While the present invention has been described with respect to certain preferred embodiments, it will be apparent to those skilled in the art that various changes and modifications may be made without departing from the scope of the invention as defined in the following claims.

What is claimed is:

1. A method for depositing a metal film by using a chemical vapor deposition process, comprising the steps of:

loading a substrate to a reactor maintained at a temperature of around 200° C. where a metal film will be deposited;

heating the substrate to a temperature ranging from about 350° C. to about 900° C. to densify the metal film as simultaneous to a deposition of the metal film; and depositing the metal film on the substrate by adding a precursor of the metal film and a reaction gas having a reducing ability to the heated substrate.

2. The method as recited in claim 1, wherein the metal film is any one selected from a group consisting of Ru, Fe, Os, Co, Rh, Ir, Ni, Pd and Pt.

3. The method as recited in claim 2, wherein the deposited metal film is a Ru film, and a precursor of the Ru film is any one selected from a group consisting of $TRuL_2$, $RuL_5$, $DRuL_3$, TRuD, $D_2RuL$, $RuX_2$ and $RuX_3$.

4. The method as recited in claim 3, wherein the X is any one selected from a group consisting of $H_2$, alkyl having about 1 to 10 carbon branches, alkenyl having about 2 to 10 carbon branches, alkoxy having about 1 to 8 carbon branches, aryl having about 6 to 12 carbon branches, β-diketonate, cyclopentadienyl, alkyl-cyclo-pentadienyl having about 1 to 8 carbon branches and a derivative of the above listed substrates added with one of halogen elements.

5. The method as recited in claim 3, wherein the T is any one selected from a group consisting of a linear triene, a branched triene, a cyclic triene, a bicyclic triene and a tricyclic triene, wherein the D is any one selected from a group consisting of a linear diene, a branched diene, a cyclic diene, a bicyclic diene and a tricyclic diene, and wherein the L is any one selected from a group consisting of CO, CS, $CS_2$, RCN, RNC, $NR_3$, $NR_2R'$, ROR', RSR', polyester having2 about 2 to 20 carbon branches, polyamine having about 2 to 20 carbon branches and a derivative of the above substrates added with one of halogen elements such as fluorine (F).

6. The method as recited in claim 5, wherein each of the R and R' is any one selected from a group consisting of $H_2$, alkyl having about 1 to 10 carbon branches and a derivative of the alkyl having about 1 to 10 carbon branches added with one of halogen elements.

7. The method as recited in claim 1, wherein the reaction gas having the reducing ability is any one selected from a group consisting of $NH_3$, $H_2$, hydrazine ($N_2H_4$), $Me_2NNH_2$, $NH_2R$, $MHR_2$, $NR_3$, alkyl hydrazine having about 1 to 10 carbon branches, dialkyl hydrazine having about 1 to 10 carbon branches or a mixed gas of the above substrates, and wherein the R is any one selected from a group consisting of $H_2$, alkyl having about 1 to 10 carbon branches, alkenyl having about 2 to 10 carbon branches, alkoxy having about 1 to 8 carbon branches, aryl having about 6 to 12 carbon branches and a derivative of the above substrates added with one of halogen elements.

8. A method for forming a capacitor, comprising the steps of:

forming an inter-layer insulating layer on a substrate;

forming a connection pattern stacked sequentially of a plug contacting to the substrate by passing through the inter-layer insulating layer and a diffusion barrier layer;

maintaining, a reactor at a temperature of around 200° C.;

depositing a metal film for a bottom electrode on the connection pattern by employing a chemical vapor deposition process with use of a reductive reaction gas at a temperature ranging from about 350° C. to about 900° C. so to perform the deposition and densification of the metal film simultaneously; and forming sequentially a dielectric layer and a top electrode on the metal film.

9. The method as recited in claim 8, wherein the reaction gas having a reducing ability is any one selected from a group consisting of $NH_3$, $H_2$, hydrazine ($N_2H_4$), $Me_2NNH_2$, $NH_2R$, $NHR_2$, $NR_3$, alkyl hydrazine having about 1 to 10 carbon branches, dialkyl hydrazine having about 1 to 10 carbon branches and a mixed gas of the above substrates, and wherein the R is any one selected from a group consisting of $H_2$, alkyl having about 1 to 10 carbon branches, alkenyl having about 1 to 10 carbon branches, alkoxy having about 1 to 8 carbon branches, aryl having about 6 to 12 carbon branches and a derivative of the above substrates added with one of halogen elements.

10. The method as recited in claim 8, wherein the metal film for the bottom electrode is any one selected from a group consisting of Ru, Fe, Os, Co, Rh, Ir, Ni, Pd and Pt.

* * * * *